US008472560B2

(12) United States Patent
Rezayee et al.

(10) Patent No.: US 8,472,560 B2
(45) Date of Patent: Jun. 25, 2013

(54) APPARATUS AND METHOD FOR DETECTING RFID SIGNALS

(75) Inventors: Afshin Rezayee, Richmond Hill (CA); Yue Yang, Toronto (CA)

(73) Assignee: SecureKey Technologies Inc., Toronto, Ontario (CA)

( * ) Notice: Subject to any disclaimer, the term of this patent is extended or adjusted under 35 U.S.C. 154(b) by 373 days.

(21) Appl. No.: 12/917,901

(22) Filed: Nov. 2, 2010

(65) Prior Publication Data
US 2012/0105211 A1    May 3, 2012

(51) Int. Cl.
*H03K 9/00*    (2006.01)
(52) U.S. Cl.
USPC ........... 375/316; 375/324; 375/219; 340/10.1
(58) Field of Classification Search
None
See application file for complete search history.

(56) References Cited

U.S. PATENT DOCUMENTS

| | | | | |
|---|---|---|---|---|
| 5,987,075 | A * | 11/1999 | Abe et al. | 375/334 |
| 6,340,932 | B1 | 1/2002 | Rodgers et al. | |
| 7,197,279 | B2 | 3/2007 | Bellantoni | |
| 2006/0186995 | A1 * | 8/2006 | Wu et al. | 340/10.1 |
| 2008/0089453 | A1 * | 4/2008 | Komatsu | 375/346 |

FOREIGN PATENT DOCUMENTS

| | | |
|---|---|---|
| CA | 2465651 | 5/2005 |
| EP | 0992931 | 4/2000 |

OTHER PUBLICATIONS

Meillere et al., "13.56 MHz COMS transceiver for RFID applications", Analog Integrated Circuit Signal Processing, 2006, vol. 49, pp. 249-256.
ISO/IEC JTC1/SC17, "ISO/IEC CD 14443-2.2 (Revision) Identification cards—Contactless integrated circuit(s) cards—Proximity cards—Part 2: Radio frequency power and signal interface", Nov. 7, 2007.
Cho et al., "An Analog Front-end IP for 13.56MHz RFID Interrogators" IEEE, ASP-DAC 2005, pp. 1208-1211.
Alegre et al., "Fast-Settling Envelope Detectors", IEEE Instrumentation and Measurement Technology Conference, Sorrento, Italy, Apr. 24-27, 2006, pp. 926-929.
Auer et al., "Design and development of a mixed signal prototyping system to achieve very high data rates for contactless applications", Elektrotechnik & Informationstechnik, 2008, 125/4, pp. 138-142.
Cha et al., "A Highly-Linear Radio-Frequency Envelope Detector for Multi-Standard Operation", IEEE Radio Frequency Integrated Circuits Symposium, 2009, pp. 149-152.
Alegre et al., "A Low-Ripple Fast-Settling CMOS Envelope Detector", IEEE, 2006.

(Continued)

*Primary Examiner* — Brian Zimmerman
*Assistant Examiner* — Kevin Lau
(74) *Attorney, Agent, or Firm* — Bereskin & Parr LLP/S.E.N.C.R.L., s.r.l.

(57) ABSTRACT

A mixed-mode signal detection apparatus suitable for ISO/IEC 14443 Type A and Type B RFID proximity card applications. The apparatus combines switched capacitor sampling and digital post processing to recover information from Amplitude Shift Keying (ASK) modulated signals. A phase detector triggers a pulse generator, which is used to signal sample and hold units that store the peak value of each carrier signal cycle. The samples are used to form a discrete version of the modulation signal and are post-processed digitally to recover encoded signal information.

17 Claims, 5 Drawing Sheets

OTHER PUBLICATIONS

Kim et al., "A CMOS Transceiver for Multistandard 13.56-MHz RFID Reader SoC", IEEE Transactions on Industrial Electronics, vol. 57, No. 5, May 2010, pp. 1563-1572.

Kim et al., "An Ultra Compact CMOS Transceiver for HF Multistandard RFID Reader", IEEE International Symposium on Radio-Frequency Integration Technology, 2006, pp. 48-51.

Finkenzeller, "RFID Handbook: Fundamentals and Applications in Contactless Smart Cards and Identification", Second Edition, 2003, John Wiley & Sons, Ltd.

Lee et al., "All-MOS ASK Demodulator for Low-Frequency Applications", IEEE Transactions on Circuits and Systems—II Express Briefs.

Razavi, "RF Microelectronics, 7.8.1 RC-CR Network", 1998, Prentice Hall PTR, pp. 236-240.

International Search Report and Written Opinion dated Jan. 9, 2012, International Application No. PCT/CA2011/001185.

* cited by examiner

APPARATUS AND METHOD FOR DETECTING RFID SIGNALS

FIELD

The embodiments described herein relate to apparatuses and methods for detecting radio-frequency identification (RFID) signals and in particular to apparatuses and methods for detecting RFID signals using an integrated circuit RFID reader.

INTRODUCTION

RFID is a contactless communication technology that uses electromagnetic waves to exchange data between a pair of devices colloquially known as an RFID tag and an RFID reader, for the purposes of automatic identification or tracking of people, animals, products or other objects.

An RFID tag, sometimes also called an RFID label or proximity integrated circuit card (PICC), generally comprises an integrated circuit (IC) and an antenna. Other elements, such as a processor, may also be included or integrated with the IC. The integrated circuit can be used to store and process information, modulate and demodulate a radio-frequency (RF) signal and perform other functions. The antenna is used for transmitting and receiving the RF signal.

Tags may be generally classified as passive or active. Passive tags can be powered via an external electromagnetic field, such as that supplied by the RFID reader. Active tags may use a battery to power the integrated circuit and other elements. In some cases, a battery may be used to assist in transmission to provide greater range, or to power other elements associated with the tag device.

An RFID reader, sometimes also called an RFID interrogator or proximity coupling device (PCD), generally comprises an antenna, an RF transmitter for transmitting a carrier signal, an antenna for coupling the carrier signal with an RFID tag, an RF receiver for detecting the coupled carrier signal and a decoder for extracting the signal information encoded by the RFID tag from the coupled carrier signal. Typically, the same antenna is used both to transmit the carrier signal and detect the coupled signal from the RFID tag. The RFID reader may also modulate the carrier signal to transmit information to the RFID tag. In some cases, the RFID reader may also comprise other elements, such as a microprocessor, to enable more advanced processing or communication.

One widely-used standard for RFID applications is the ISO/IEC 14443 standard, the entire content of which is hereby incorporated by reference. The standard describes different modulation methods, coding schemes and protocol initialization procedures, depending on the type of tag (e.g., Type A or Type B). Other related standards for RFID applications, such as MIFARE and FeliCA, are also in use or development.

In the ISO/IEC 14443 system, tags may have a proximity operating range of less than 10 cm. In the case of credit card-based RFID systems, the operation range may be less than 1 cm. According to ISO/IEC 14443, Type A and Type B RFID tags may not have an active power source and may be powered by the RFID reader via inductive coupling. The RFID reader transmits a 13.56 MHz carrier signal, which is used to power the tags, and which is also modulated by both the reader and card to exchange information.

SUMMARY

In a first aspect, there is provided an apparatus for detecting an RFID signal in a carrier signal, wherein the carrier frequency is a multiple M of a subcarrier frequency of the RFID signal. The apparatus can comprise a phase detector for generating a clock control signal based on the carrier signal; a pulse generator, the pulse generator configured to provide a predetermined sequence of trigger pulses when triggered by the clock control signal; a plurality of sample and hold units, each of the plurality of sample and hold units comprising a first storage element to store a first value of the RFID signal and a second storage element to store a second value of the RFID signal, wherein the second value is delayed by N cycles of the carrier signal relative to the first value, wherein each of the first and second storage elements are activated according to the predetermined sequence of trigger pulses; and, for each of the plurality of sample and hold units, a primary comparator configured to receive the first value and the second value as inputs and output a detected value of the RFID signal for the respective sample and hold unit.

The apparatus may further comprise, for each of the plurality of sample and hold units, a secondary comparator configured to receive the first value and the second value as inputs, wherein the inputs of the secondary comparator are reversed as compared to the primary comparator, and a digital signal processor configured to receive the output of each primary comparator and each secondary comparator, and decode a logic level encoded in the RFID signal.

The digital signal processor may be configured to disregard signal values received from a respective sample and hold unit in the plurality of sample and hold units when the output of the primary comparator differs from the output of the secondary comparator for the respective sample and hold unit.

The predetermined sequence may be configured to activate each of the first storage elements one after another in a pre-configured order.

In some cases, a primary hysteresis voltage can be applied at the second value input of the primary comparator. In some cases, a secondary hysteresis voltage can be applied at the first value input of the secondary comparator. In some cases, the primary hysteresis voltage can be equal to the secondary hysteresis voltage.

The phase detector may comprise a first passive RC network for high pass filtering the carrier signal to generate the clock control signal. Additionally, the phase detector may also comprise a second passive RC network for low pass filtering the RFID signal.

In some cases, there may be a tuning element for controllably adjusting a delay factor of the first passive RC network.

In some cases, the apparatus may further comprise a first threshold compensation element to automatically compensate for inherent offset voltage of the primary comparator. The apparatus may also comprise a second threshold compensation element to automatically compensate for inherent offset voltage of the secondary comparator.

In one example, the plurality of sample and hold units comprises M/2 sample and hold units.

In some cases, N is between 0 and M-1. In some specific cases, N is M/2. In some specific cases M is 16.

In another aspect, there is provided a method for detecting an RFID signal in a carrier signal, wherein the carrier frequency is a multiple M of a subcarrier frequency of the RFID signal. The method can comprise generating a clock control signal based on the carrier signal using a phase detector; generating a predetermined sequence of trigger pulses, each of the trigger pulses triggered by the clock control signal; using a plurality of sample and hold units, storing a first value of the RFID signal in a first storage element of each sample and hold unit, and storing a second value of the RFID signal in a second storage element of each sample and hold unit, wherein the second value is delayed by N cycles of the carrier signal relative to the first value, wherein each of the first and second storage elements are activated according to the predetermined sequence of trigger pulses; and, for each of the plurality of sample and hold units, comparing the first value and the second value using a primary comparator and outputting a detected value of the RFID signal for the respective sample and hold unit.

DRAWINGS

For a better understanding of the various embodiments described herein, and to show more clearly how they may be carried into effect, reference will now be made, by way of example only, to the accompanying drawings which show at least one exemplary embodiment, and in which.

Figure 1:
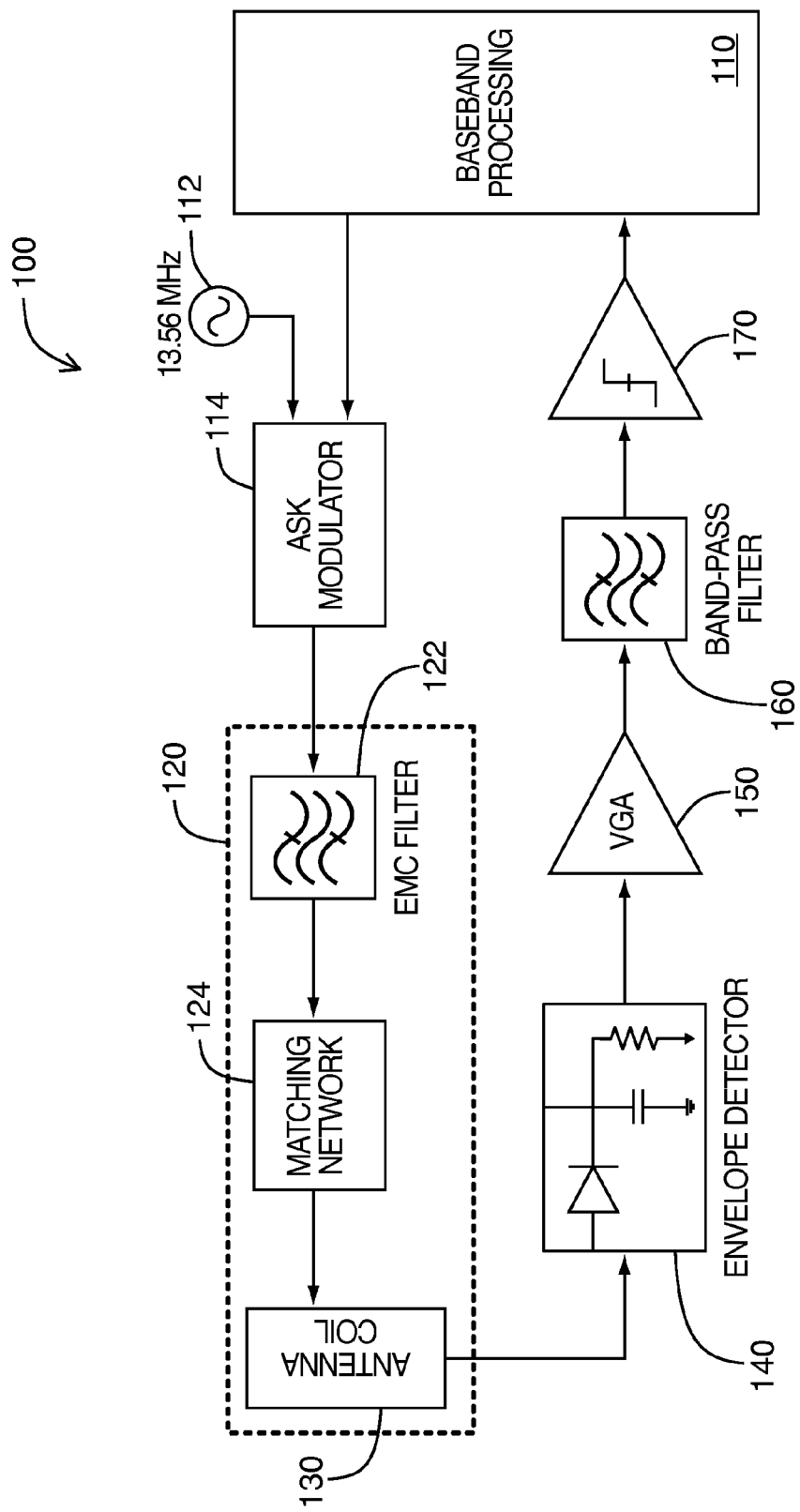
FIG. 1 is a simplified circuit diagram of an example prior art RFID reader.

The skilled person in the art will understand that the drawings, described below, are for illustration purposes only. The drawings are not intended to limit the scope of the applicants' teachings in any way.

DESCRIPTION OF VARIOUS EMBODIMENTS

It will be appreciated that for simplicity and clarity of illustration, where considered appropriate, reference numerals may be repeated among the figures to indicate corresponding or analogous elements or steps. In addition, numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail since these are known to those skilled in the art. Furthermore, it should be noted that this description is not intended to limit the scope of the embodiments described herein, but rather is presented for the purposes of describing one or more exemplary implementations.

The transmitter portion of an RFID reader is well-understood and relatively straightforward to design with given specifications. However, the receiver portion of an RFID reader and, in particular, the analog receiver portion presents at least two challenges.

A first challenge in the RFID receiver portion is presented by the small modulation amplitude introduced by an RFID tag relative to the carrier amplitude transmitted by the reader.

Passive tags in particular may not have sufficient power to produce relatively strong modulation as compared to the carrier signal. Accordingly, for low power consumption and high efficiency, RFID tags can transfer data via load modulation at a data rate determined in part by a subcarrier frequency. For ISO/IEC 14443 Type A and Type B systems, the subcarrier frequency is 847.5 kHz, which generally corresponds to a data rate of 847.5 kbps. In other RFID applications, other types of modulation schemes may be employed.

Modulation can be accomplished by switching a load impedance of the tag on and off. When the tag is within sufficient proximity of the reader, and when the reader is activating the tag by transmitting an interrogation signal, the load impedance on the card may be inductively coupled to the reader antenna. Accordingly, the amplitude of the carrier signal on the reader antenna will be modulated in response to the switching load impedance of the tag.

However, even for proximities of less than 1 cm between the tag and the reader, the modulation amplitude may be very weak relative to the carrier signal amplitude. For example, the modulation amplitude may be −40 dB relative to the carrier signal amplitude. In some cases the relative amplitude may be even lower. In still other cases, it may be higher. Correctly extracting information from such a relatively weak signal presents a signal processing challenge.

A second challenge presented by current approaches is the unknown DC voltage component of the envelope of the modulation signal. As a consequence of the small modulation amplitude discussed above, significant amplification of the modulated signal is necessary. However, if the DC component of the modulation is not completely removed, it will be amplified with the signal, thus making it very difficult to set a correct comparator threshold for subsequent processing (e.g., when the analog signal is converted to digital).

Referring now to FIG. 1, there is shown a simplified circuit diagram of an example prior art RFID reader. RFID reader 100 demonstrates an analog frontend design targeted for ISO/IEC 14443 applications. Under this approach, the receiver of RFID reader 100 employs an envelope detector to extract the envelope of the carrier for subsequent filtering and amplification, before conversion to a digital signal. RFID reader 100 may comprise a processor 110, clock generator 112, modulator 114, filter 122, matching network 124, antenna 130, envelope detector 140, amplifier 150, bandpass filter 160 and comparator 170.

Processor 110 may be a digital signal processor, field programmable gate array or general purpose processor used to generate signals for encoding and transmitting to an RFID tag, and for decoding signals received from an RFID tag.

The transmitter portion of RFID reader 100 may comprise the processor 110, clock generator 112, modulator 114 and antenna network 120. A digital input signal from processor 110, is input to modulator 114 for modulation. Modulator 114 may be an ASK modulator. A clock generator 112 may provide a reference signal to be modulated by modulator 114 using the input signal provided by processor 110. For example, for an ISO/IEC 14443 application, the reference signal may be a periodic signal with a frequency of 13.56 MHz (e.g., carrier frequency). The reference signal may be filtered to generate a sinusoidal carrier signal.

Following modulation, the modulated carrier signal may pass through an electromagnetic compatibility (EMC) filter 122 and an antenna impedance matching network 124. Subsequently, the modulated carrier signal may be transmitted by antenna 130. Typically, the EMC filter, matching network and the antenna are implemented off-chip.

The receive portion of RFID reader 100 detects information from the RFID tag, which may be transmitted by load modulation at the tag and inductively coupled to the same antenna 130.

A rectifier-based envelope detector 140 may be used to extract the carrier envelope, which should represent the baseband signal. In practice, a rectifier-based envelope detector suffers greatly from process variations. For example, in a rectifier-based envelope detector with an RC network, random process variations can alter resistor and capacitor values, resulting in fluctuations in the RC time constant on the order of ±50%. More advanced designs of rectifier-based envelope detectors have been proposed, but the adverse effects of process variation cannot be entirely eliminated due to the direct involvement of passive components in envelope tracking.

Sensitivity and signal to noise ratio (SNR) are generally related according to an inverse relationship. This property significantly complicates the design of a highly sensitive envelope detector. That is, high sensitivity generally leads to poor SNR and high SNR generally leads to low sensitivity.

Following envelope detection, the detected envelope may be further amplified by a variable gain amplifier 150 (VGA) and fed through a bandpass filter 160 to remove out-of-band noise from the signal. A high quality VGA and bandpass filter is typically critical in this approach, due to the low SNR of the detected envelope, as noted above.

Finally, a high gain amplifier or comparator 170 may be used to convert the output of the bandpass filter 160 to a digital signal. The comparator threshold is typically programmable, because this architecture generally cannot fully remove the DC component of the baseband signal.

However, a programmable comparator threshold may not be suitable for volume production because process variations and random device mismatches make it difficult to find a single comparator threshold that will work for all fabricated devices. Furthermore, the DC voltage component of the received signal envelope is not known. Therefore, the optimum comparator threshold may change depending on the transmitter and antenna performance of the RFID reader.

Figure 2:
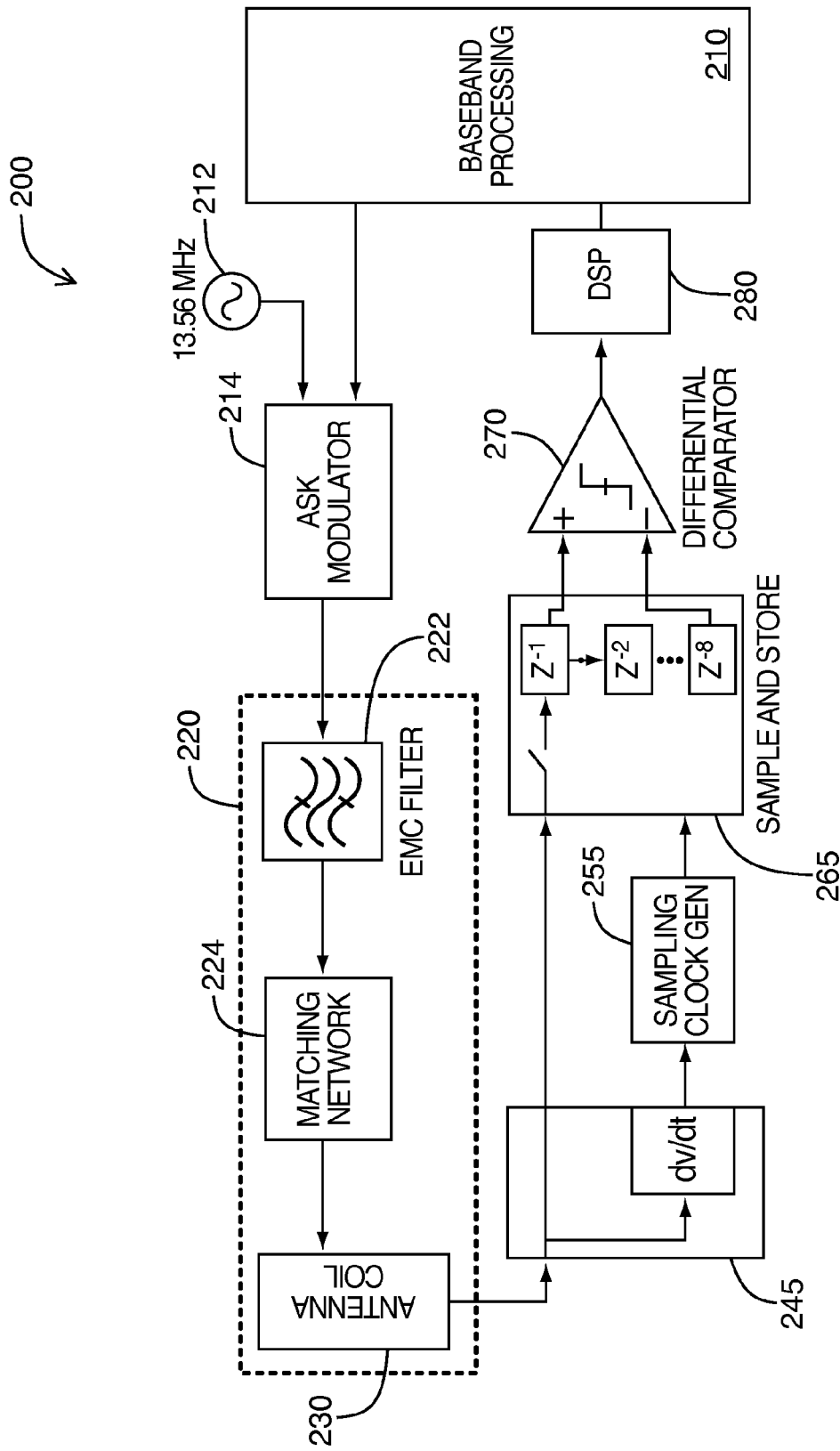
FIG. 2 is a simplified circuit diagram of an example RFID reader.

Referring now to FIG. 2, there is shown a simplified circuit diagram of an example RFID reader. RFID reader 200 demonstrates a frontend design that may be used for ISO/IEC 14443 applications. RFID reader 200 may comprise a processor 210, clock generator 212, modulator 214, filter 222, matching network 224, antenna 230, phase detector 245, clock generator 255, sample and store circuit 265, differential comparator 270 and digital signal processor 280.

In general, the transmitter portion of RFID reader 200 may correspond to the transmitter portion of RFID reader 100. Accordingly, processor 210, clock generator 212, modulator 214, filter 222, matching network 224 and antenna 230 generally correspond to processor 110, clock generator 112, modulator 114, filter 122, matching network 124 and antenna 130, respectively.

The receiver portion of RFID reader 200 employs a discrete time approach instead of the continuous time architecture of RFID reader 100.

In operation, the modulated carrier signal, such as that received from an RFID tag, passes through a suitable phase detector 245 such as, for example, a set of RC filters. A first filtered signal may be unchanged (e.g., lowpass filtered). A second filtered signal may be filtered to generate a derivative or phase-delayed version of the modulated signal. The second filtered signal may be input to a sampling clock generator 255. The derivative property of the second filtered signal is useful, as the zero crossings of the second filtered signal will coincide with the maxima or minima of the first filtered signal (e.g., the modulated signal). Accordingly, the sampling clock generator 255 can generate a sampling clock from the second filtered signal so that the rising edge of the clock coincides with the peak value of a carrier cycle in the modulated signal. As a result, a sample and store unit 265 that is triggered by the sampling clock can sample the peak value of the first filtered signal. Alternatively, the sampling clock can be generated so that the minimum value, or other suitable value, of the carrier cycle in the modulated signal is sampled by the sample and store unit 265.

The sample and store unit 265 can be configured to save the peak value of each carrier cycle. The sample and store unit 265 may also retain previous samples, and provide samples that are separated by a predetermined sampling period to the differential inputs of comparator 270. The predetermined sampling period may be between zero and one subcarrier period of the RFID data signal. For example, a sampling period of one half the subcarrier period, corresponding to eight cycles of the RFID carrier signal, can be used.

At comparator 270, a sample input to the first differential input can be differentially compared to another sample that is delayed by a the predetermined sampling period (or vice versa). This differential approach can cancel the amplitude contribution of the carrier signal itself, leaving the modulated signal and any remaining noise in the signal.

The output of comparator 270 can be sent to DSP 280 as a digital input, to identify or reject spurious input values, which may be due to noise in the signal or receiver, and decode the comparator output to generate a digital baseband signal.

In some cases, DSP 280 may be integrated with baseband processor 210.

Accordingly, instead of trying to recover the full envelope of the modulated carrier signal, as in the example of FIG. 1, RFID reader 200 samples the peak values of the modulated carrier signal to obtain a discrete version of the envelope signal.

As noted above, peak values are generally compared to other values that are a predetermined sampling period apart. In the ISO/IEC 14443 standard, the peak values can be compared to other values between zero and fifteen carrier cycle periods apart, as the ISO/IEC 14443 Type A and Type B subcarrier frequency is 847.5 kHz, or one sixteenth of the carrier frequency (13.56 MHz). For example, the peak values can be compared eight carrier cycles apart, as a duration of eight carrier cycles can capture the maximum modulation amplitude change and thereby detect logic transitions when ASK modulation is used.

Figure 3:
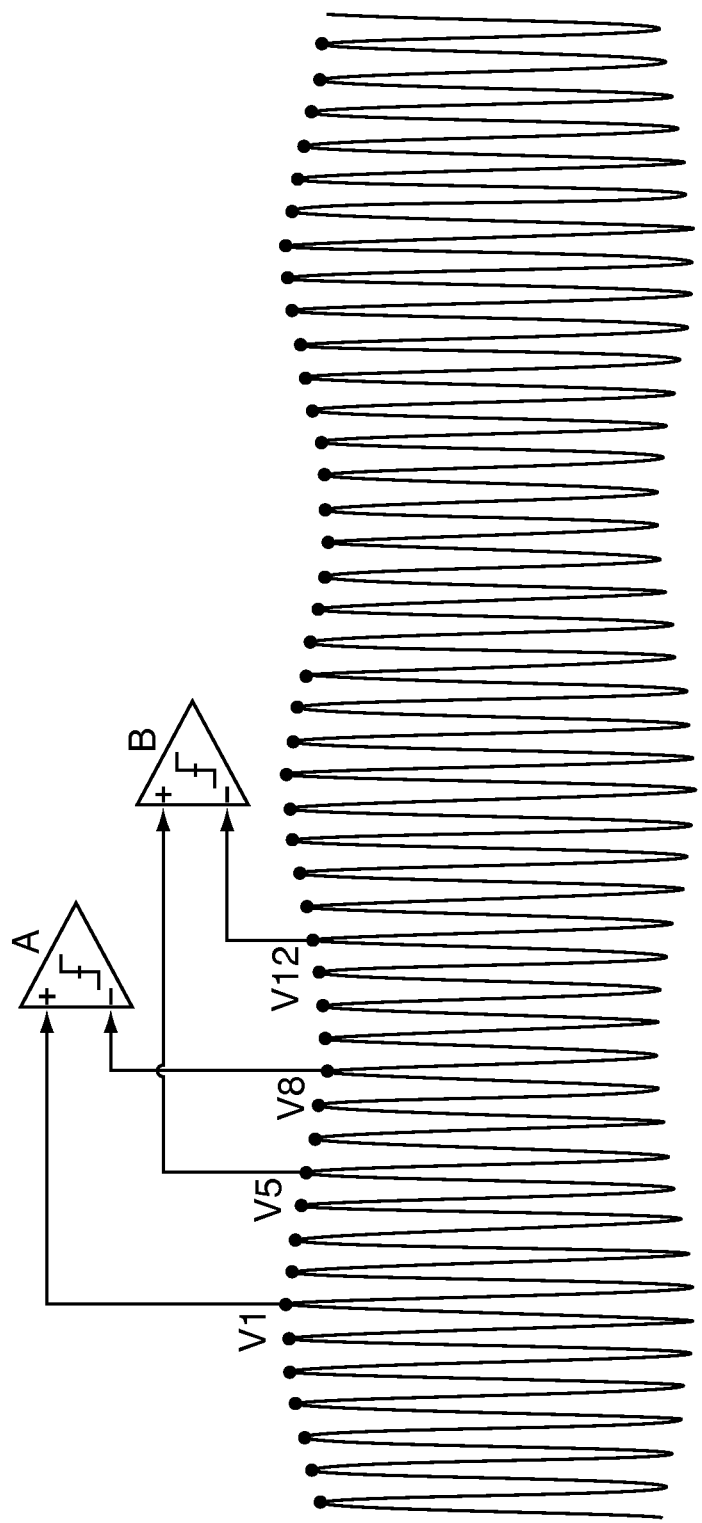
FIG. 3 is an example signal plot to demonstrate sampling times and comparator inputs.

Referring now to FIG. 3, there is shown an example signal plot to demonstrate sampling times and comparator inputs. Each dot represents a sample of the modulated carrier signal stored by sample and store unit 265. Comparators A and B represent the differential comparison operation of comparator 270 at times tA and tB, respectively.

At time tA, signal value V8 is compared to signal value V1, which was sampled 8 carrier cycles (one half cycle of the subcarrier) earlier. This comparison captures both the peak and trough of the modulated signal, and may be used, for example, to detect a negative transition from logic one to a logic zero.

However, in some cases the comparison may not provide a reliable result due to the choice of sampling time, signal noise, clock jitter, or any combination thereof. For example, at time tB, signal value V5 is compared to signal value V12. Both signal values V5 and V12 correspond to a similar voltage level, because they are both sampled near the zero crossing of the modulation signal. Accordingly, noise in the signal or jitter in the sampling clock may cause the comparator output to sway one way or another. To avoid spurious results, comparator outputs stemming from this situation should be discarded.

In some cases, the DSP can be configured to post process comparator outputs according to a model of the comparator hysteresis thresholds.

The sampling of only peak values has the effect of removing the noise contribution of the carrier signal, which can be the largest source of noise. Moreover, the differential comparison of two peak values has the effect of removing the DC component of the envelope of the modulated signal.

Figure 4:
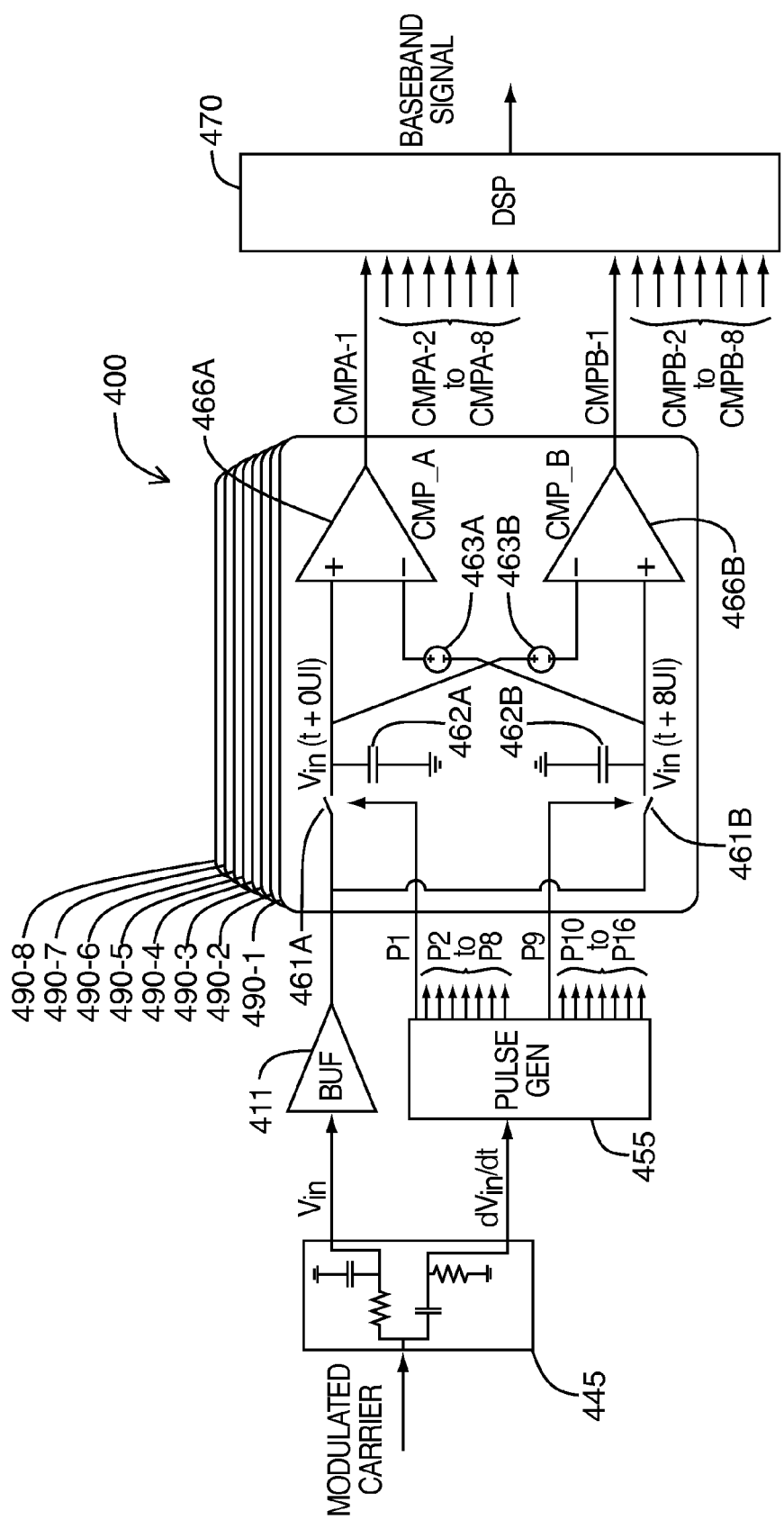
FIG. 4 is a simplified circuit diagram of an example receiver frontend for the RFID reader of FIG. 2.

Referring now to FIG. 4, there is illustrated a simplified circuit diagram of an example receiver frontend for RFID reader 200.

In general, receiver 400 comprises a phase detector 445, a buffer 411, a pulse generator 455, one or more sample, hold and compare units 490 and a digital signal processor 470. Phase detector 445 may employ a passive RC network on the receive path to filter the modulated carrier and provide versions of the modulated carrier at its output. The passive RC network may comprise a first passive RC network for high pass filtering the modulated carrier signal to generate a delayed copy of the signal. The passive RC network may also comprise a second passive RC network for low pass filtering the modulated carrier signal.

The two copies of the signal can be 90° apart from each other, although the precise relationship is determined by specific the properties of the RC network. As the carrier can be generally a periodic waveform approximating a sinusoidal waveform, a 90° phase delay can cause the delayed copy of the signal to approximate the derivative (dVin/dt) of the non-delayed copy (Vin) of the modulated carrier (taking advantage of the trigonometric property wherein the derivative of sin(x) is cos(x)). As explained above, a negative zero crossing of dVin/dt generally corresponds to a peak value of Vin for a particular carrier cycle. This property can be exploited by pulse generator 455 to generate trigger pulses for the sample, hold and compare units 490, to be used for sampling the modulated signal Vin. Accordingly, the delayed copy of the signal may be used as a clock control signal for pulse generator 455.

In some cases, a tuning element circuit may be provided to adjust the RC time constant or delay factor of phase detector 445. The tuning circuit may comprise a digitally adjustable resistor in parallel with a capacitor. This resistor can comprise a plurality of parallel resisters. Each of the parallel resistors may be controlled by a switch connected in series with the resistor. The switches can be digitally turned on or off to enable or disable the corresponding resistance. Accordingly, the time constant of the RC network and, therefore, the delay of the RC network can be digitally controlled by varying the shunt resistor value.

Figure 5:
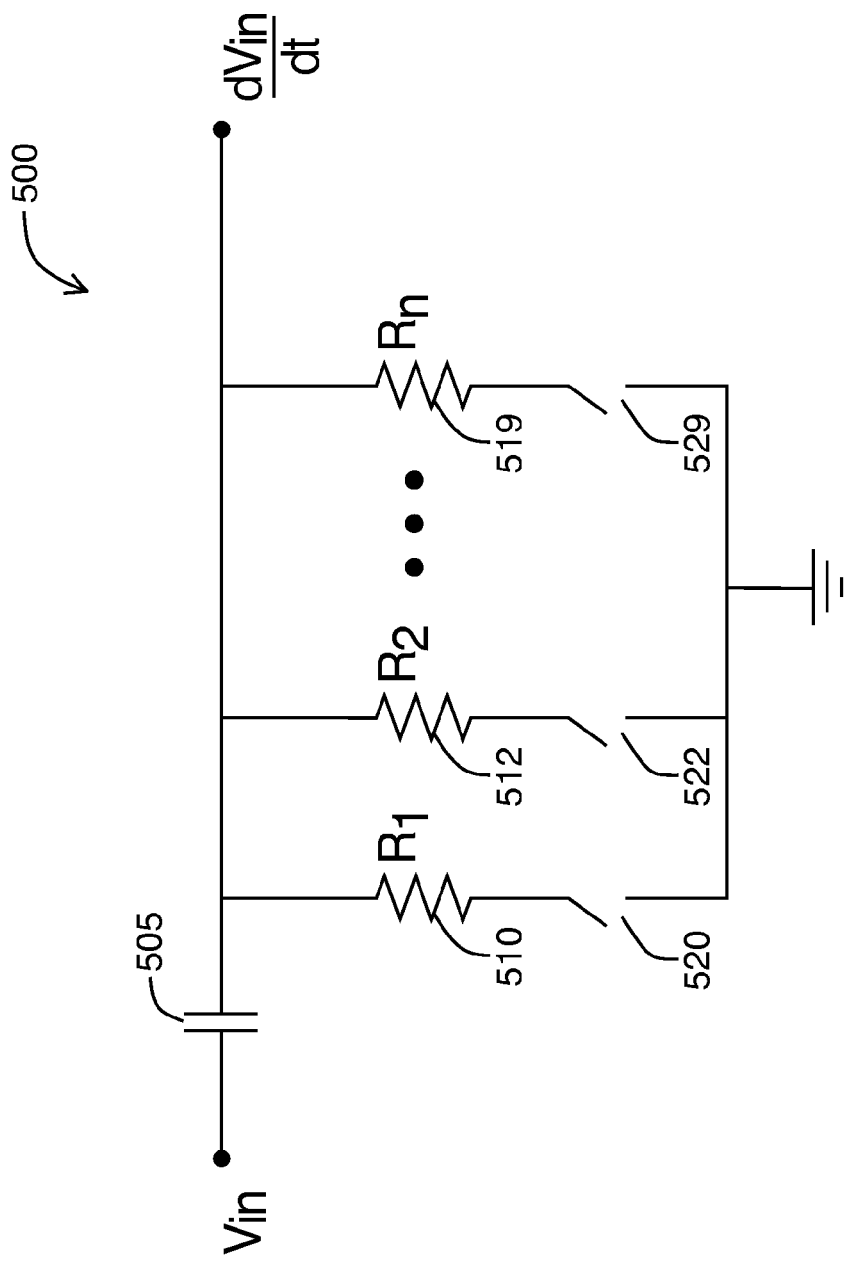
FIG. 5 is a circuit diagram of an example tuning element for the RC network of the RFID reader of FIG. 4.

Referring now to FIG. 5, there is illustrated a circuit diagram of an example tuning element 500 for the RC network of the RFID reader of FIG. 4. Tuning element 500 comprises a series capacitor 505 and a plurality of resistors 510 to 519 connected in parallel. Each of the parallel resistors is connected in series to a switch 520 to 529, respectively. In operation, each of the switches can enable its corresponding resistor to adjust the value of Referring again to FIG. 4, each sample, hold and compare (SHC) unit 490 comprises first and second switches 461A and 461B, respectively, and first and second storage elements 462A and 462B, respectively. Storage elements 462A and 462B may be capacitive elements. Each SHC unit 490 may comprise first and second threshold compensation elements, such as programmable offset voltage sources 463A and 463B, and differential comparators 466A and 466B. In some cases, one or both offset voltage sources 463A and 463B may be omitted. In some other cases, a single offset voltage source may be supplied to both differential comparators 466A and 466B. In still other cases, only a single comparator may be used, with or without the offset voltage sources.

Offset voltage sources 463A and 463B may be used to introduce an artificial hysteresis, explained in further detail below.

In a first case, there may be a plurality of SHC units 490 (shown as 490-1 to 490-8). The number of SHC units 490 may correspond to one half the carrier to subcarrier frequency ratio. For example, in ISO/IEC 14443 applications, the carrier to subcarrier frequency ratio, referred to herein as M, is 13 560 000:847 500, or 16:1. Accordingly, one half of M is eight. In the simplest case, the number of SHC units is determined by one half the ratio, M/2=8. In other cases, the number of SHC units may be between one and fifteen.

Pulses from pulse generator 455 can trigger the switches of each SHC unit. In operation, pulse generator 455 can be configured to trigger the switches of each SHC unit in a predetermined sequence, for example one unit after another, so that cumulatively the plurality of SHC units stores a sequence of sample values and a sequence of delayed sample values. Individually, each SHC unit stores a sample value and a delayed sample value. The delayed sample value can be delayed by, for example, M/2 cycles of the carrier frequency. Accordingly, pulse generator 455 can send pulses—a primary pulse followed by a secondary pulse delayed by M/2 cycles of the carrier frequency—to each SHC unit alternately activating switch 461A and 461B.

In the example of FIG. 4, pulse generator 455 has sixteen output lines P1 to P16. For each detected clock period of the carrier signal, pulse generator 455 sends a pulse on one output line, in sequence from P1 to P16. Once the sixteen pulses have been sent, the sequence repeats. Output line P1 can be connected to switch 461A of SHC unit 490-1, output line P2 can be connected to switch 461A of SHC unit 490-2, and so on. Correspondingly, output line P9 can be connected to switch 461B of SHC unit 490-1, output line P10 can be connected to switch 461B of SHC unit 490-2, and so on.

Accordingly, pulse generator can send a sequence of pulses corresponding to each cycle of the carrier frequency within the subcarrier period. The sequence can repeat once it is complete, according to the number of SHC units and the subcarrier frequency. For the ISO/IEC 14443 application, M can be 16 and therefore the pulse generator can send a repeating sequence of sixteen pulses and repeat the sequence thereafter.

In some cases, the number of SHC units may vary. If fewer SHC units are used, the pulse generator frequency must be increased and DSP processing adjusted accordingly. In some cases, the SHC units may also be modified to store additional delayed values.

To compare the peak values of the modulated carrier signal Vin, M samples can be sampled and stored. In such cases, the maximum and minimum peaks in each period are M/2 cycles apart.

Storage elements 462A and 462B store peak values of Vin at times t+0UI and t+8UI, where UI is a unit interval corresponding to one carrier frequency period. In the case of ISO/IEC 14443 applications, there may be a total of eight pairs of storage elements 46A and 462B, which can be time interleaved as described above to store sixteen samples of Vin from time t+0UI to t+15UI. Storage elements are reused as the process continues. For example, at time t+16UI, the value of Vin stored at time t+0UI can be discarded and the newly freed storage element can store the value of Vin at time t+16UI.

A buffer 411 may be inserted between phase detector 445 and the storage elements to increase drive strength and match any incidental delays generated by the phase detector and pulse generator.

For each pair of storage elements, SHC unit comprises at least one comparator (e.g., comparator 466A), which is sufficient to obtain a digital output. However in some cases, each SHC unit may have a second comparator 466B. Use of a second comparator enables the creation of an artificial hysteresis using one or more offset voltage sources 463A and 463B.

In operation, the same two sampled and stored values will be provided to both comparators. However, the inputs to the comparators may be reversed. Furthermore, voltage offset sources 463A and 463B may introduce offsets as illustrated in FIG. 4. Specifically, a primary hysteresis voltage offset from source 463A may be added to the delayed sample value and the combined value input to a primary comparator 466A. Conversely, a secondary hysteresis voltage offset from source 463B may be added to the non-delayed sample value and the combined value input to a secondary comparator 466B. The voltage offsets may be selected to be the same, or may be calibrated to compensate for internal hysteresis variations of the comparators, if these are known and different.

Using this approach, an artificial hysteresis, denoted by the differential voltage Voff, can be introduced. Accordingly, the outputs of comparators 466A and 466B will both be highly only when Vin(t+0UI) is higher than Vin(t+8UI)+Voff. Likewise, the outputs of comparators 466A and 466B will both be low only when Vin(t+0UI) is lower than Vin(t+8UI)−Voff.

If the outputs of comparators 466A and 466B differ, this may be the result of noise or other spurious input. Each primary comparator 466A can provide an output CMPA to DSP 470. Likewise, each secondary comparator 466B can provide an output CMPB to DSP 470. Accordingly, a series of outputs CMPA-1 to CMPA-8, corresponding to the primary comparators 466A of SHC units 490-1 to 490-8 is supplied to DSP 470. Likewise, a series of outputs CMPA-9 to CMPA-16, corresponding to the secondary comparators 466BA of SHC units 490-1 to 490-8 is supplied to DSP 470.

Based on the primary and secondary comparator outputs of each SHC unit, DSP 470 may determine whether the signal value is overwhelmed by noise and discard or ignore the comparator outputs.

Accordingly, the receiver can robustly detect and decode data modulated onto a carrier signal by an RFID tag by recovering a discrete version of the carrier envelope obtained by sampling at the peak value of each carrier cycle. This approach removes the carrier signal, a primary noise contributor, thereby improving the raw signal to noise ratio before amplification. Further, the differential comparison eliminates the problem of a DC component when detecting a carrier envelope.

It will be appreciated that for simplicity and clarity of illustration, where considered appropriate, reference numerals may be repeated among the figures to indicate corresponding or analogous elements or steps. In addition, numerous specific details are set forth in order to provide a thorough understanding of the exemplary embodiments described herein. However, it will be understood by those of ordinary skill in the art that the embodiments described herein may be practiced without these specific details. In other instances, well-known methods, procedures and components have not been described in detail since these are known to those skilled in the art. Furthermore, it should be noted that this description is not intended to limit the scope of the embodiments described herein, but rather is presented for the purposes of describing one or more exemplary implementations.

The invention claimed is:

1. An apparatus for detecting an RFID signal in a carrier signal, wherein the carrier frequency is a multiple M of a subcarrier frequency of the RFID signal, the apparatus comprising:
   a phase detector for generating a clock control signal based on the carrier signal;
   a pulse generator, the pulse generator configured to provide a predetermined sequence of trigger pulses when triggered by the clock control signal;
   a plurality of sample and hold units, each of the plurality of sample and hold units comprising a first storage element to store a first value of the RFID signal and a second storage element to store a second value of the RFID signal, wherein the second value is delayed by N cycles of the carrier signal relative to the first value, wherein each of the first and second storage elements are activated according to the predetermined sequence of trigger pulses; and
   for each of the plurality of sample and hold units, a primary comparator configured to receive the first value and the second value as inputs and output a detected value of the RFID signal for the respective sample and hold unit.

2. The apparatus of claim 1, further comprising:
   for each of the plurality of sample and hold units, a secondary comparator configured to receive the first value and the second value as inputs, wherein the inputs of the secondary comparator are reversed as compared to the primary comparator; and
   a digital signal processor configured to receive the output of each primary comparator and each secondary comparator, and decode a logic level encoded in the RFID signal.

3. The apparatus of claim 2, wherein the digital signal processor is configured to disregard signal values received from a respective sample and hold unit in the plurality of sample and hold units when the output of the primary comparator differs from the output of the secondary comparator for the respective sample and hold unit.

4. The apparatus of claim 1, wherein the predetermined sequence is configured to activate each of the first storage elements one after another in a preconfigured order.

5. The apparatus of claim 2, wherein a primary hysteresis voltage is applied at the second value input of the primary comparator.

6. The apparatus of claim 2, wherein a secondary hysteresis voltage is applied at the first value input of the secondary comparator.

7. The apparatus of claim 6, wherein the primary hysteresis voltage is equal to the secondary hysteresis voltage.

8. The apparatus of claim 1, wherein the phase detector comprises a first passive RC network for high pass filtering the carrier signal to generate the clock control signal.

9. The apparatus of claim 8, wherein the phase detector further comprises a second passive RC network for low pass filtering the RFID signal.

10. The apparatus of claim 8, further comprising a tuning element for controllably adjusting a delay factor of the first passive RC network.

11. The apparatus of claim 1, further comprising a first threshold compensation element to automatically compensate for inherent offset voltage of the primary comparator.

12. The apparatus of claim 2, further comprising a second threshold compensation element to automatically compensate for inherent offset voltage of the secondary comparator.

13. The apparatus of claim 1, wherein the plurality of sample and hold units comprises M/2 sample and hold units.

14. The apparatus of claim 1, wherein N is between 0 and M−1.

15. The apparatus of claim 14, wherein N is M/2.

16. The apparatus of claim 15, wherein M is 16.

17. A method for detecting an RFID signal in a carrier signal, wherein the carrier frequency is a multiple M of a subcarrier frequency of the RFID signal, the method comprising:
- generating a clock control signal based on the carrier signal using a phase detector;
- generating a predetermined sequence of trigger pulses, each of the trigger pulses triggered by the clock control signal;
- using a plurality of sample and hold units, storing a first value of the RFID signal in a first storage element of each sample and hold unit, and storing a second value of the RFID signal in a second storage element of each sample and hold unit, wherein the second value is delayed by N cycles of the carrier signal relative to the first value, wherein each of the first and second storage elements are activated according to the predetermined sequence of trigger pulses; and
- for each of the plurality of sample and hold units, comparing the first value and the second value using a primary comparator and outputting a detected value of the RFID signal for the respective sample and hold unit.

* * * * *